United States Patent
Cranford, Jr. et al.

[19]

[11] Patent Number: 5,942,999
[45] Date of Patent: Aug. 24, 1999

[54] CONTROLLABLE INTEGRATED LINEAR ATTENUATOR FOR A D/A CONVERTER

[75] Inventors: Hayden Clavie Cranford, Jr., Apex; Raymond Paul Rizzo, Raleigh, both of N.C.

[73] Assignee: International Business Machines Corporation, Armonk, N.Y.

[21] Appl. No.: 08/910,956

[22] Filed: Aug. 8, 1997

[51] Int. Cl.$^6$ .................................................. H03M 1/66
[52] U.S. Cl. ............................................ 341/144; 330/261
[58] Field of Search ................................ 341/118, 136, 341/144, 135; 330/250, 260, 261, 259

[56] References Cited

U.S. PATENT DOCUMENTS

| | | | |
|---|---|---|---|
| 4,733,219 | 3/1988 | Reusens et al. | 340/347 |
| 4,843,390 | 6/1989 | van Bavel et al. | 341/139 |
| 5,027,120 | 6/1991 | Thurston | 341/143 |
| 5,155,385 | 10/1992 | Gotoh et al. | 307/296.8 |
| 5,162,799 | 11/1992 | Tanimoto | 341/143 |
| 5,293,166 | 3/1994 | Ta | 341/166 |
| 5,392,040 | 2/1995 | Hayashi | 341/143 |
| 5,451,948 | 9/1995 | Jekel | 341/139 |
| 5,452,014 | 9/1995 | Manley | 348/57 |

OTHER PUBLICATIONS

BTR–CF88 Peur — BAXA6 200 Mhz CMOS 4S Video DAC Macro, S. J. Stratz, Oct. 20, 1993 pp. 1–12.

*Primary Examiner*—Marc S. Hoff
*Assistant Examiner*—Peguy JeanPierre
*Attorney, Agent, or Firm*—Joscelyn G. Cockburn; John B. Frisone

[57] ABSTRACT

An integrated D/A converter has a first feedback circuit for generating a first bias voltage to compensate for systemic changes. A second feedback circuit includes a plurality of switchable current sources biased by the first bias voltage and controlled by an externally supplied attenuation control signal to generate a second bias voltage which is applied to control the D/A current sources.

6 Claims, 3 Drawing Sheets

CONTROLLABLE INTEGRATED LINEAR ATTENUATOR FOR A D/A CONVERTER

FIELD OF THE INVENTION

The invention relates to integrated circuits in general and more particularly to an integrated linear attenuator for controlling the magnitude of the output of a co-located digital to analog (D/A) converter as a function of an external control signal supplied by an external source such as a load circuit.

BACKGROUND

Common practice in the prior art, for controlling the output of a D/A converter as a function of an externally provided control signal, is to provide a separate attenuator constructed from discrete components or a separate integrated circuit chip. A typical prior art implementation is illustrated in FIG. 1 in which the output (Q/QN) of the D/A converter 10 is connected to a load circuit 11 by a separate attenuator circuit 12 and a cable 14. The load 14 provides a feedback control signal 15 to the attenuator circuit 12 to control the magnitude of the D/A output signal.

The D/A converter 10 of FIG. 1 is shown in greater detail in FIG. 2. It includes a plurality of current sources A1–An. The current sources are similar in construction and are typically weighted by controlling the dimensions of a transistor Q1. Transistors Q2 and Q3 switch the current provided by Q1 into one of two paths under control of the digital input signal. The outputs from the current sources A1–An are combined and provided as Q and QN to the attenuator 12.

Common to all of the current sources is a compensated bias line 20, which supplies a DC bias voltage to the gate ports of the P-channel transistors Q1 of each current source. To keep the desired output load current constant and settable, a closed loop comprised of transistor Q4, voltage VREF, operational amplifier U1 and resistor R1 is employed. Operation is performed by adjusting the current down through the drain of transistor Q4 by the voltage gain of amplifier U1. Amplifier U1 will approximate equal input voltages on its +/− inputs; therefore, the current down through the drain of Q4 is equal to the value of VREF divided by the value of R1.

Because all of the transistors Q1 in the current sources are located on the same silicon as transistor Q4 and (under normal conditions) located in close physical proximity to each other, good matching characteristics can be obtained. Therefore, the physical dimensions of channel width and length will determine the relative current values. The described loop will compensate for temperature and supply voltage changes as well as tolerances added by the manufacturing process.

SUMMARY OF THE INVENTION

The invention contemplates an integrated digital to analog converter in which a plurality of current sources which provide the analog output are biased by two feedback control circuits operating in tandem. The first feedback control circuit generates a bias voltage which compensates for systemic variations. The second feed back control circuit includes a plurality of switchable current sources which are biased by the bias voltage provided by the first feedback circuit to incorporate the systemic correction. These current sources are switched as a function of a external control signal in order to attenuate the analog output by modifying the bias voltage applied to the output current sources.

DETAILED DESCRIPTION OF THE INVENTION

Figure 1:
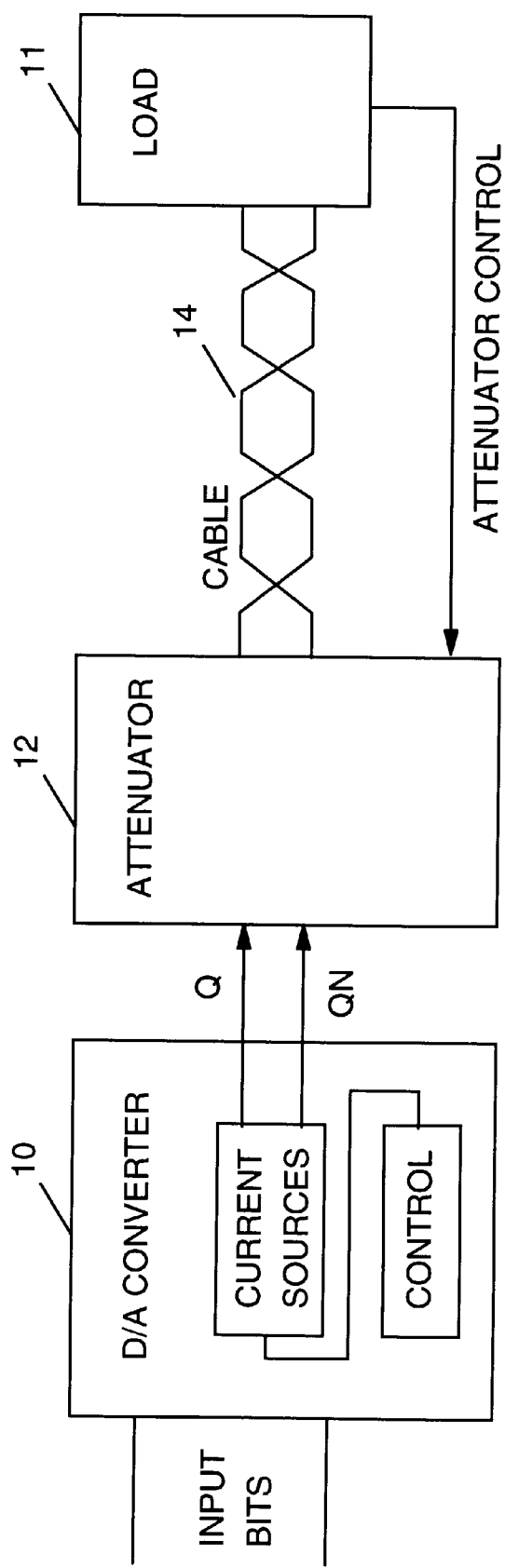
FIG. 1 is a block diagram of prior art non-integrated attenuator for controlling the output of a D/A converter as a function of an externally supplied control signal.
Figure 2:
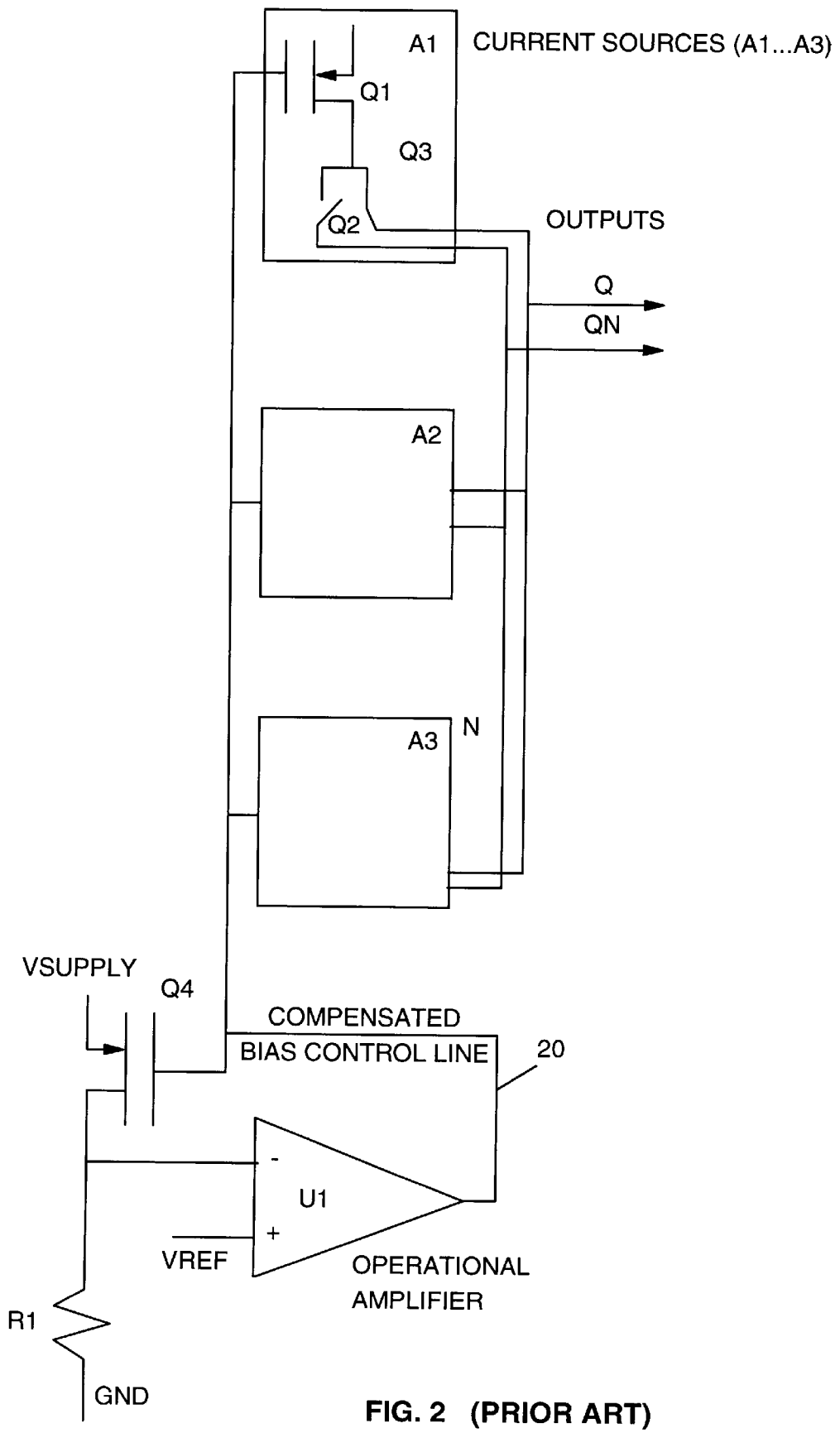
FIG. 2 is a detailed block/schematic diagram of the prior art D/A converter illustrated in FIG. 1; and, FIG. 3 is a detailed block/schematic diagram of an integrated linear attenuator constructed according to the invention for attenuating the output of a co-located D/A converter as a function of an externally supplied control signal.
Figure 3:
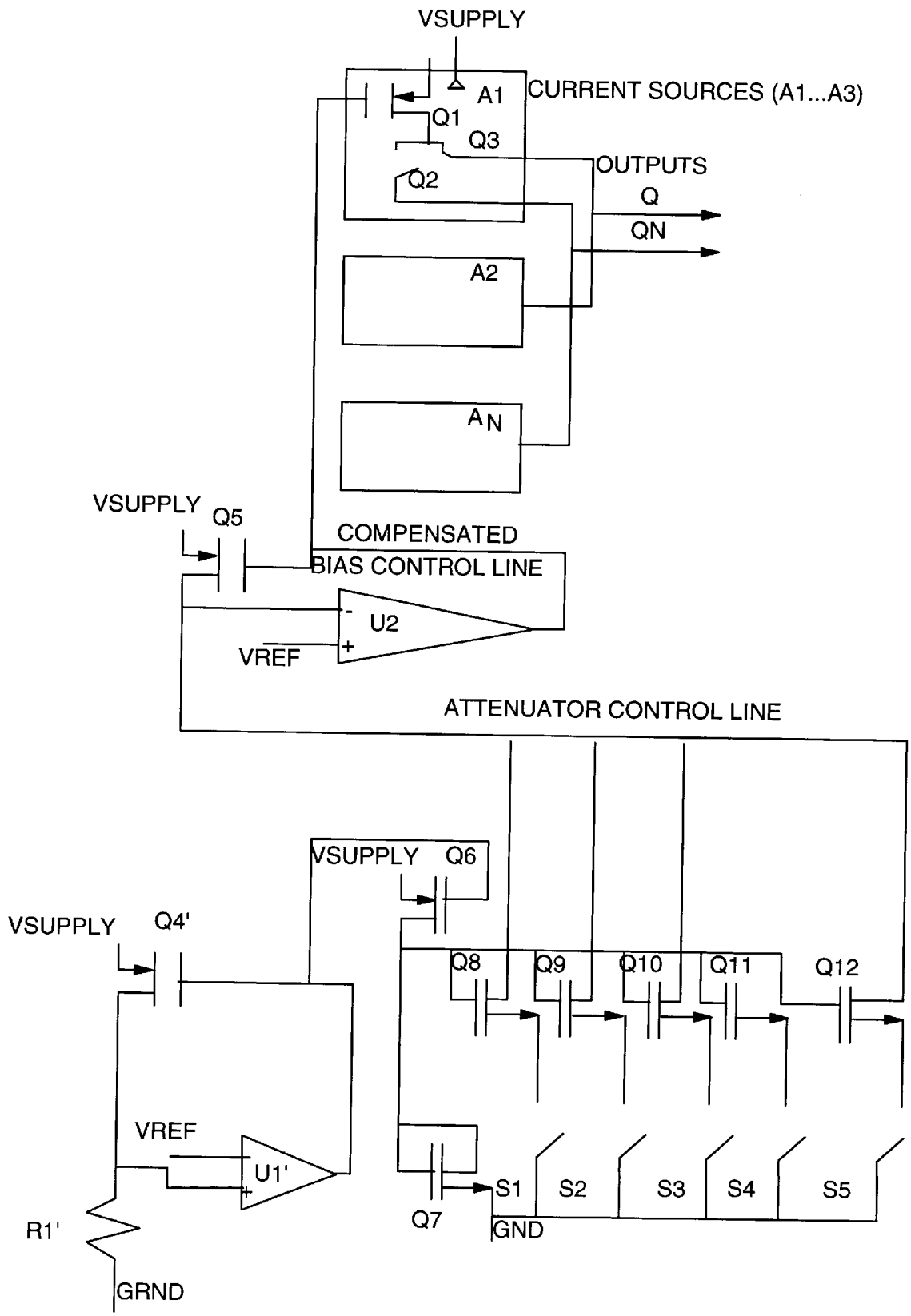

The basic D/A converter illustrated in FIG. 3 includes a plurality of current sources A1–An. These are identical to the current sources illustrated in FIG. 2 and described above. Before continuing with the description of FIG. 3 an analysis of a converter stage implemented in MOSFET technology will be made.

The analysis will focus on the area of operation which allows control of the MOSFET currents, via alteration of the gate voltages, while maintaining biasing constant with operation in the saturation region. Transistors Q1 are current sources in the D/A converter stages while transistors Q2 and Q3 act as switching devices, under control of the digital input signal, for directing the current from Q1 to either the positive or negative output.

For the MOSFET Q1 to act as a high output impedance current source it is necessary for it to remain biased in the saturation region over the entire output voltage range. As long as this is true, the current remains relatively constant with respect to power supply variations. The current will also remain a fixed percentage with respect to other current sources in the D/A converter. As long as proper biasing is maintained, the current sources can be increased or decreased in unison and their relationship to each other will remain constant.

For MOSFET Q1 the drain current in the linear region is $$I_{DS} = uCO \cdot W/L((V_{GS} - V_T - V_{DS}/2) \cdot V_{DS})$$

where:

$V_{GS}$ is the gate to source voltage;

$V_{DS}$ the drain to source voltage;

$V_T$ is the MOSFET threshold voltage; and in the linear region $V_{DS} \leq V_{GS} - V_T$ There is a direct dependence of the drain current on the drain to source voltage $V_{DS}$. If Q1 is always biased in this linear region, the output current changes as the output voltage changes. If Q1 is always biased in the saturation region, then $V_{DS} \geq V_{GS} - V_T$ and the approximate drain current is:

$$I_{DS} = uCo/2 \cdot W/L(V_{GS} - V_T)^2$$

As $V_{GS}$ is varied $I_{DS}$ will vary in a squared relationship. All D/A current sources will vary by this same squared relationship. Since all current sources can be held constant or varied in unison by the same ratio, the control circuit illustrated in FIG. 3 provides the desired attenuator function. If it is required to vary the attenuation in a linear relationship to the control voltage ($V_{GS}$) all that is required is to vary $V_{GS}$ in a non-linear fashion to compensate for the squared relationship.

In FIG. 3 a closed loop including a transistor Q4', voltage VREF, operational amplifier U1' and resistor R1' is employed (for the reasons set forth above) to compensate for temperature and supply voltage changes as well as tolerances added by the manufacturing process. A second loop responsive to the output from the first loop and to the control signals supplied by the load generates a bias voltage for application to the gate ports of transistors Q1. This bias voltage includes both compensation and control.

The second loop includes a transistor Q5, VREF, operational amplifier U2 and a control circuit including transistors Q6–Q12 and switches S1–S5 associated with current supply transistors Q8–Q12, respectively. Switches S1–S5 are under control of the externally provided attenuator feedback control signal and selectively open or close the current path for the n channel transistors Q8–Q12.

Depending on the physical dimensions of the transistors, a relative current weight can be set and will track in magnitude to a close constant ratio to one another. As described above a current value is established down through resistor R1' equal to the value of VREF divided by R1'. This current value is mirrored in the drain current of transistor Q6, which is physically on the same silicon as Q4' and has the same channel length and width as Q4'. This current is supplied to N-channel transistor Q7, which establishes a current reference for transistors Q8–Q12.

Since the gates of these transistor are tied together and have the same voltage value, the currents down through transistors Q8–Q12 will be proportional to the current set by the current down through transistor Q7. By adjusting the channel widths of transistors Q8–Q12 conversion of the external digital attenuator control signal to an analog equivalent signal can be accomplished. The sum of the currents down through transistors Q8–Q12 is used to adjust the current down through transistor Q5 which (as described above) adjusts the output current sources to perform the desired attenuator function.

We claim:

1. An integrated digital to analog converter including an attenuator for attenuating the output of the digital to analog converter as a function of an attenuation control signal comprising:
    a semiconductor member including a plurality of selectable first current sources located in said member, each of said first current sources including a control element responsive to a bias voltage for adjusting the magnitude of the current provided by each first current source and switching circuit arrangement for selecting the output of the current sources in response to a digital input signal which is to be converted to an analog state;
    a first circuit located in said semiconductor member in close proximity to the first selectable current sources for providing a first bias voltage compensated for systemic variations affecting the semiconductor member and the first current sources; and,
    a second circuit located in said semiconductor member and responsive to an externally supplied attenuation control signal and the said first bias voltage for providing a second bias voltage which is a function of the first bias voltage and the externally supplied attenuation control signal and for applying the second bias voltage to the control element of the first selectable current sources for adjusting the magnitude of the current supplied by each of the selectable current sources as a function of the externally supplied attenuation control signal.

2. An integrated digital to analog converter as set forth in claim 1 in which:
    said first circuit includes a second current source and a first feedback control circuit for providing said first bias voltage for regulating the second current source to compensate for systemic changes; and
    said second circuit includes;
        a third current source having a control element for controlling the magnitude of the current supplied by the third current source,
        a first load circuit responsive to the first bias voltage and the externally provided attenuation control signal for adjusting the said first load circuit and for receiving the current supplied by the third current source and providing a voltage determined by the current supplied by the third current source and the state of the adjustable load circuit,
        and, a second feedback control circuit responsive to the reference voltage and to the voltage supplied by the said first load circuit for providing said second bias voltage to the control elements of the first and third current sources to equalize the applied voltages by regulating the current in the third current source and for attenuating the output of the digital to analog converter as a function of the externally supplied attenuation control signal.

3. An integrated digital to analog converter as set forth in claim 1 in which:
    said first circuit includes;
        a second current source including a control element for regulating the magnitude of the current supplied by the second current source,
        a second load circuit for receiving the current from the second current source and providing a voltage related to the magnitude of the current supplied by the second current source,
        a fixed source of reference voltage,
        a first feedback control circuit responsive to the reference voltage and the voltage supplied by the second load circuit for providing said first bias voltage to the control element for adjusting the current supplied by the second current source to equalize the supplied voltages; and
    said second circuit includes;
        a third current source having a control element for controlling the magnitude of the current supplied by the third current source,
        a first adjustable load circuit responsive to the first bias voltage and the externally provided attenuation control signal for adjusting the first load circuit and for receiving the current supplied by the third current source and providing a voltage determined by the current supplied by the third current source and the state of the adjustable first load circuit,
        and, a second feedback control circuit responsive to the reference voltage and to the voltage supplied by the adjustable first load circuit for providing said second bias voltage to the control elements of the first and third current sources to equalize the applied voltages by regulating the current in the third current source and attenuating the output of the digital to analog converter as a function of the externally supplied attenuation control signal.

4. An integrated digital to analog converter comprising:
    a semiconductor member including a plurality of first current sources located in said member, each of said first current sources including a control element responsive to a bias voltage for adjusting the magnitude of the current;
    a first circuit located in said semiconductor member in close proximity to the first current sources for providing a first bias voltage compensated for systemic variations affecting the semiconductor member and the first current sources said first circuit including a second current source and a first feedback control circuit for providing a first bias voltage for regulating the second current source to compensate for systemic changes; and a second circuit located in said semiconductor member and responsive to an externally supplied control signal and the said first bias voltage for providing a second bias voltage which is a function of the first bias voltage and the externally supplied control signal and for applying the second bias voltage to the control elements of the first current sources for adjusting the magnitude of the current supplied by each of the current sources as a function of the externally supplied control signal, said second circuit including a first load circuit responsive to the first bias voltage and to the externally supplied control signal for adjusting the load as a function of the first bias voltage and the externally supplied control signal, a third current source connected to said first load circuit and, a second feedback control circuit connected to the first load circuit and the first and third current source for providing the second bias voltage to control the current supplied by the first and third current sources.

5. An integrated digital to analog converter as set forth in claim 4 in which the load circuit includes:

a plurality of switchable current sources connected in parallel between the third current source and ground and responsive to the externally supplied control signal for selectively disabling the switchable current sources; and a biasing circuit responsive to the first bias voltage for biasing the switchable current sources to compensate for systemic changes.

6. An integrated digital to analog converter as set forth in claim 5 in which the switchable current sources are current weighted.

\* \* \* \* \*